(12) United States Patent
Suzuki

(10) Patent No.: US 6,882,371 B2
(45) Date of Patent: Apr. 19, 2005

(54) METHOD AND APPARATUS FOR SELECTIVE VIDEO SIGNAL SAMPLING

(75) Inventor: Yoshiteru Suzuki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 473 days.

(21) Appl. No.: 09/953,153

(22) Filed: Sep. 17, 2001

(65) Prior Publication Data

US 2002/0149700 A1 Oct. 17, 2002

(30) Foreign Application Priority Data

Apr. 12, 2001 (JP) ........................... 2001-113645

(51) Int. Cl.[7] .............................................. H03M 1/12
(52) U.S. Cl. ........................................ 348/572; 341/155
(58) Field of Search ................................. 348/572, 705, 348/706, 678; 341/158–160, 155

(56) References Cited

U.S. PATENT DOCUMENTS

| | | | | |
|---|---|---|---|---|
| 5,450,085 A | * | 9/1995 | Stewart et al. | 341/159 |
| 5,936,678 A | * | 8/1999 | Hirashima | 348/537 |
| 6,057,891 A | * | 5/2000 | Guerin et al. | 348/572 |
| 6,097,443 A | * | 8/2000 | Volmari | 348/572 |
| 6,166,775 A | * | 12/2000 | Fukuda | 348/537 |
| 6,188,443 B1 | * | 2/2001 | Mori et al. | 348/572 |
| 6,208,701 B1 | * | 3/2001 | Hiramatsu et al. | 375/354 |
| 6,590,616 B1 | * | 7/2003 | Takeuchi | 348/572 |

FOREIGN PATENT DOCUMENTS

| | | | | |
|---|---|---|---|---|
| JP | 03068293 A | * | 3/1991 | H04N/7/13 |
| JP | 160905 | | 6/1996 | |
| JP | 274476 | | 10/1997 | |

* cited by examiner

Primary Examiner—Victor R. Kostak
(74) Attorney, Agent, or Firm—Birch, Stewart, Kolasch, & Birch, LLP.

(57) ABSTRACT

A video signal sampling apparatus for sampling an input analog video signal by use of a sampling clock, and producing a digital signal which represents a level of a resultant video signal sample as a digital video signal is disclosed. The video signal sampling apparatus includes N (N being an integer equal to or greater than 2) converters for sampling the input analog video signal by use of N sampling clocks having phases that are different from each other to produce N digital signals which represent levels of N resultant video signal samples respectively, and a selector for selecting one digital signal from the N digital signals produced by the N converters in order that an amplitude of the digital video signal output to the outside is maximized.

19 Claims, 9 Drawing Sheets

METHOD AND APPARATUS FOR SELECTIVE VIDEO SIGNAL SAMPLING

FIELD OF THE INVENTION

The present invention relates to a video signal sampling apparatus used for converting an analog video signal into a digital video signal.

BACKGROUND OF THE INVENTION

A sampling clock of a certain sampling frequency is needed for performing a sampling process for converting an analog signal into a digital signal. Generally, to convert an analog video signal into a digital video signal, a sampling clock in synchronization with a horizontal sync signal or a vertical sync signal is used.

According to Nyquist's theorem, when a sampling frequency is fsc, if the highest frequency component of an input signal is lower than fsc/2, information on waveforms of the input signal is not lost, that is, original waveforms of the input signal can be reproduced with perfection. However, this holds only when the input signal and the sampling clock are in an optimum condition in terms of their phases.

Figure 8:
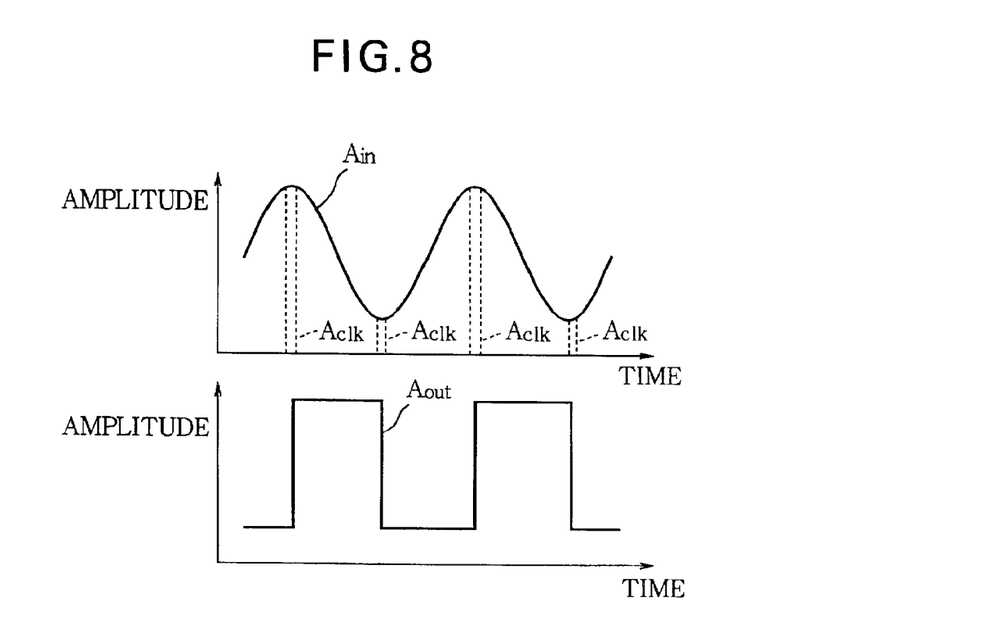
FIG. 8 is a view showing a phase relation between an input signal and a sampling clock when the amplitude of an output signal is at its maximum.

The reason for this will be explained with reference to FIGS. 8 and 9 below. FIG. 8 shows an input signal $A_{in}$ of a constant frequency and an output signal (a sample) $A_{out}$ obtained by sampling the input signal $A_{in}$ by use of a sampling clock $A_{clk}$ which has a frequency that is twice that of the input signal $A_{in}$, and is in an optimum phase relation with the input signal $A_{in}$. When the input signal $A_{in}$ is sampled by use of this optimum sampling clock $A_{clk}$, difference between the highest level and the lowest level, that is, the amplitude of a resultant output signal representing its AC component is at its maximum as apparent from FIG. 8.

Figure 9:
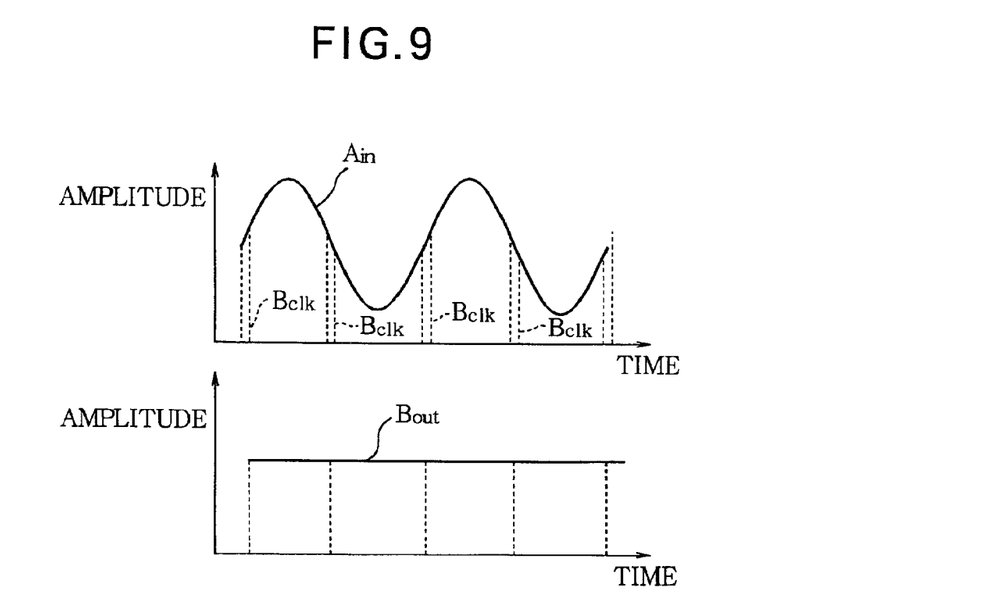
FIG. 9 is a view showing a phase relation between the input signal and the sampling clock when the amplitude of the output signal is at its minimum.

FIG. 9 shows the same input signal $A_{in}$ and an output signal $B_{out}$ obtained by sampling this same input signal $A_{in}$ by use of a sampling clock $B_{clk}$ which is 180° ($\pi$ radians) out of phase with the sampling clock $A_{clk}$. When the input signal $A_{in}$ is sampled by use of this sampling clock $B_{clk}$ that is most distant from the optimum sampling clock $A_{clk}$, the amplitude (AC component) of a resultant output signal is at its minimum (zero) as apparent form FIG. 9. As described above, if the same input signal is sampled, the amplitude of a resultant output signal varies depending on a phase of a sampling clock. It is also well known that the variation range of the amplitude of an output signal obtained by sampling an input signal depends on the frequency of a sampling clock as shown in FIG. 10.

Figure 10:
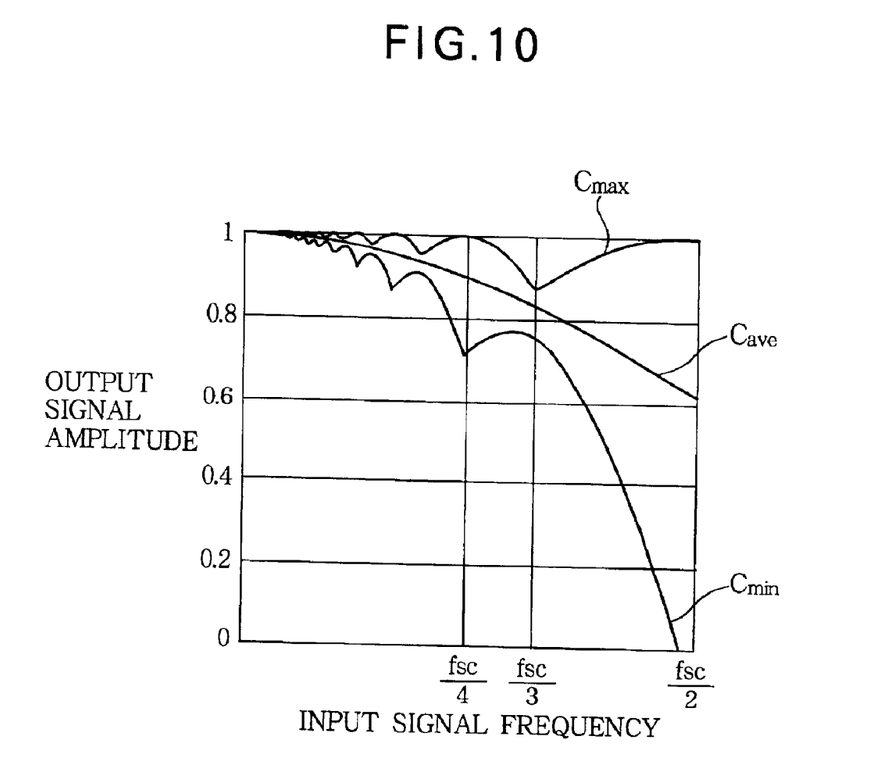
FIG. 10 is a graph for explaining how an amplitude of an output signal (a sample) is affected by a frequency and a phase of a sampling clock.

In the graph of FIG. 10, the horizontal axis represents a frequency of an input signal, and the vertical axis represents an amplitude (its maximum value is normalized to 1) of an output signal obtained by sampling the input signal by use of a sampling clock of a frequency fsc. The curve $C_{max}$ represents amplitudes of the output signal when the input signal and the sampling clock are in the optimum phase relation, the curve $C_{min}$ represents amplitudes of the output signal when they are most distant from the optimum phase relation, and the curve $C_{av}e$ represents average amplitudes of the output signal. From this graph, it is apparent that the amplitude of the output signal varies widely depending on the phase of the sampling clock not only when the frequency fsc of the sampling clock is twice that of the input signal, but also when it is three or four times that of the input signal.

OBJECT AND SUMMARY OF THE INVENTION

Accordingly, if the phase of the sampling clock shifts, the amplitude of the output signal (digital video signal) obtained by sampling the input signal varies, which degrades image quality. This image quality degradation occurs not only when a received NTSC analog video signal is converted into a digital video signal, but also when a video signal output from a solid image pickup device such as a CCD is sampled. Not alone a display apparatus using a CRT, but a matrix type display apparatus such as an LCD or a PDP (Plasma Display) involves such a problem.

The present invention has been made to solve the above-described problem with an object of providing a video signal sampling apparatus capable of outputting a digital video signal that has always an amplitude almost equal to its maximum value (an amplitude of the output signal obtained when an input signal and a sampling clock are in the optimum phase relation) irrespective of the phase of the sampling clock.

The above-described object is achieved by a video signal sampling apparatus for sampling an input analog video signal by use of a sampling clock, and producing a digital signal representing a level of a resultant video signal sample as a digital video signal to be output to the outside, said apparatus comprising:

N (N being an integer equal to or greater than 2) converters for sampling the input analog video signal by use of N sampling clocks having phases that are different from each other to produce N digital signals which represent levels of N resultant video signal samples respectively;

a selector for selecting one digital signal from the N digital signals produced by said N converters in order that an amplitude of the digital video signal output to the outside is maximized; and a switching device for outputting said one digital signal selected by said selector to the outside as the digital video signal.

The selector may have a processor for calculating, for each of the N digital signals produced by said N converters, a difference between a value at current sampling and a value at preceding sampling, and for selecting, from said N digital signals, one digital signal that has a maximum absolute value of said difference.

The video signal sampling apparatus may further comprise delay elements connected in series for delaying a reference sampling clock by $2\pi/N$ radians in succession to produce said N sampling clocks to be supplied to said N converters.

The video signal sampling apparatus may further comprise a mixer for mixing the digital video signal output from said switching device with one of said N digital signals produced by said N converters.

The above-described object is also achieved by a video signal sampling apparatus for sampling an input analog video signal by use of a sampling clock, and producing a digital signal which represents a level of a resultant video signal sample as a digital video signal to be output to the outside, said apparatus comprising:

a converter for sampling the input analog video signal by use of a sampling clock to produce a digital signal representing a level of a resultant video signal sample;

a selector for selecting one digital signal from a group of a first to N-th (N being an integer equal to or greater than 2) consecutive digital signals output from said converter in order that an amplitude of the digital video signal output to the outside is maximized; and a switching device for outputting said one digital signal selected by said selector to the outside as the digital video signal.

The selector may have a processor for calculating, for each of said first to N-th digital signals output from said converter, a difference between a value at current sampling and a value at preceding sampling, and for selecting, from said N digital signals, one digital signal that has a maximum absolute value of said difference.

The video signal sampling apparatus may further comprise (N−1) delay element or elements for delaying output of said converter by one sampling clock pulse to (N−1) sampling clock pulses respectively to produce said first to N-th digital signals.

The video signal sampling apparatus may further comprise a sample and hold circuit for decimating samples output from said switching device to 1/N.

BRIEF DESCRIPTION OF THE DRAWINGS

Embodiments of the invention will now be described by way of example and with reference to the accompanying drawings in which.

DESCRIPTION OF THE PREFERRED EMBODIMENTS

Figure 1:
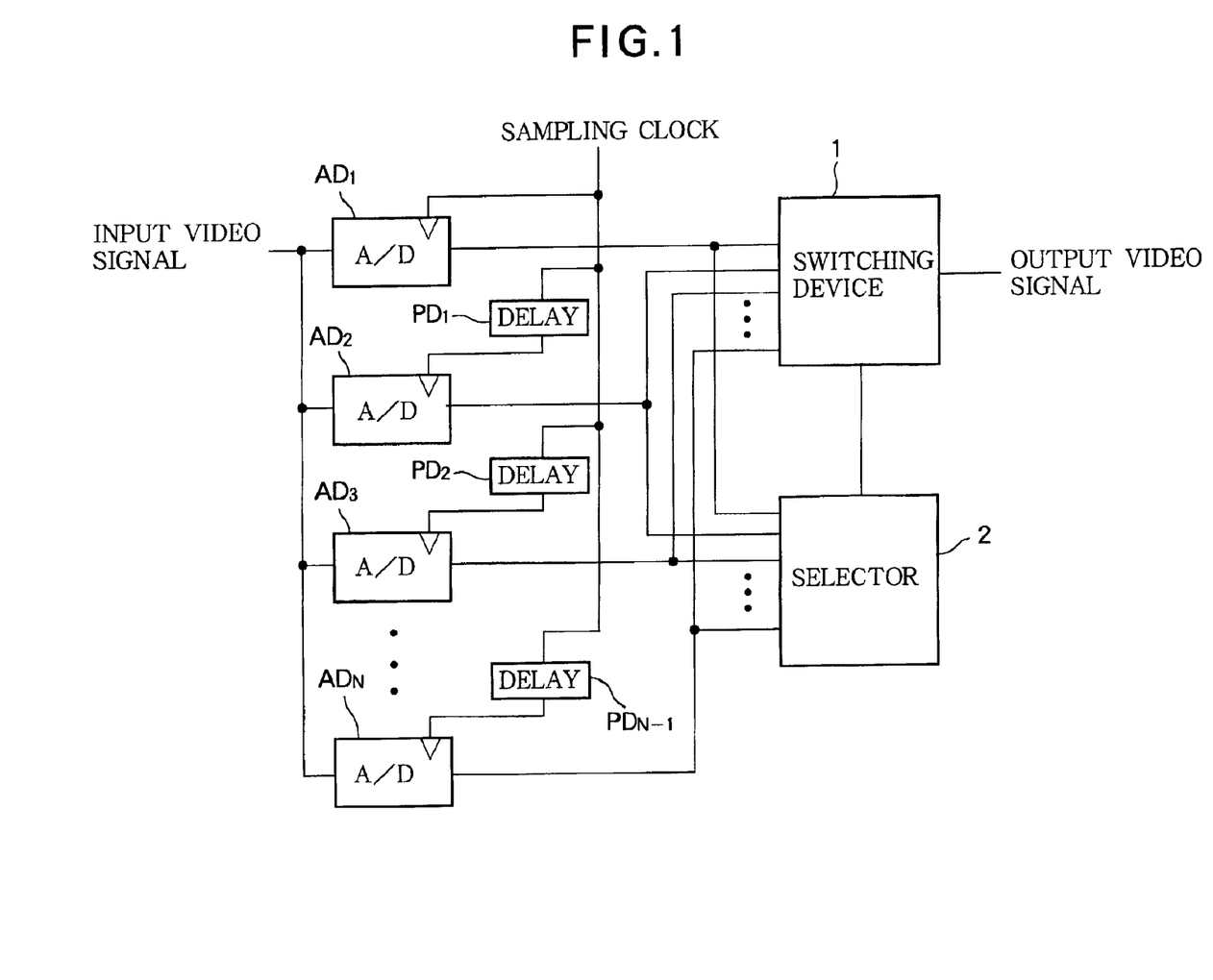
FIG. 1 is a block diagram showing a structure of a first example of the video signal sampling apparatus according to the invention.

FIG. 1 is a block diagram showing a structure of a first example of the video signal sampling apparatus according to the invention. As shown in FIG. 1, the apparatus of the first example has a first to N-th (N is an integer equal to or greater than two) A/D converters (analog-to-digital converters) $AD_1$ to $AD_N$, delay elements $PD_1$ to $PD_{N-1}$ connected to the second to N-th A/D converters $AD_2$ to $AD_N$ respectively, a switching device 1, and a selector 2.

The A/D converters $AD_1$ to $AD_N$ sample an input video signal and produce digital data which represent levels of resultant video signal samples. The delay elements $PD_1$, $PD_2$, ..., $PD_{N-1}$ delay a sampling clock by $1 \cdot 2\pi/N$, $2 \cdot 2\pi/N$, ..., $(N-1) \cdot 2\pi/N$ radians respectively. Accordingly, the times at which the A/D converters $AD_2$ to $AD_N$ produce digital data are delayed from the time at which the A/D converter $AD_1$ produces digital data by $1 \cdot 2\pi/N$, $2 \cdot 2\pi/N$, ..., $(N-1) \cdot 2\pi/N$ radians respectively. The selector 2 selects from among digital data output from the A/D converters $AD_1$ to $AD_N$ in accordance with an after-described procedure. The switching device 1 outputs digital data selected by the selector 2 to the outside as a digital video signal.

Figure 2:
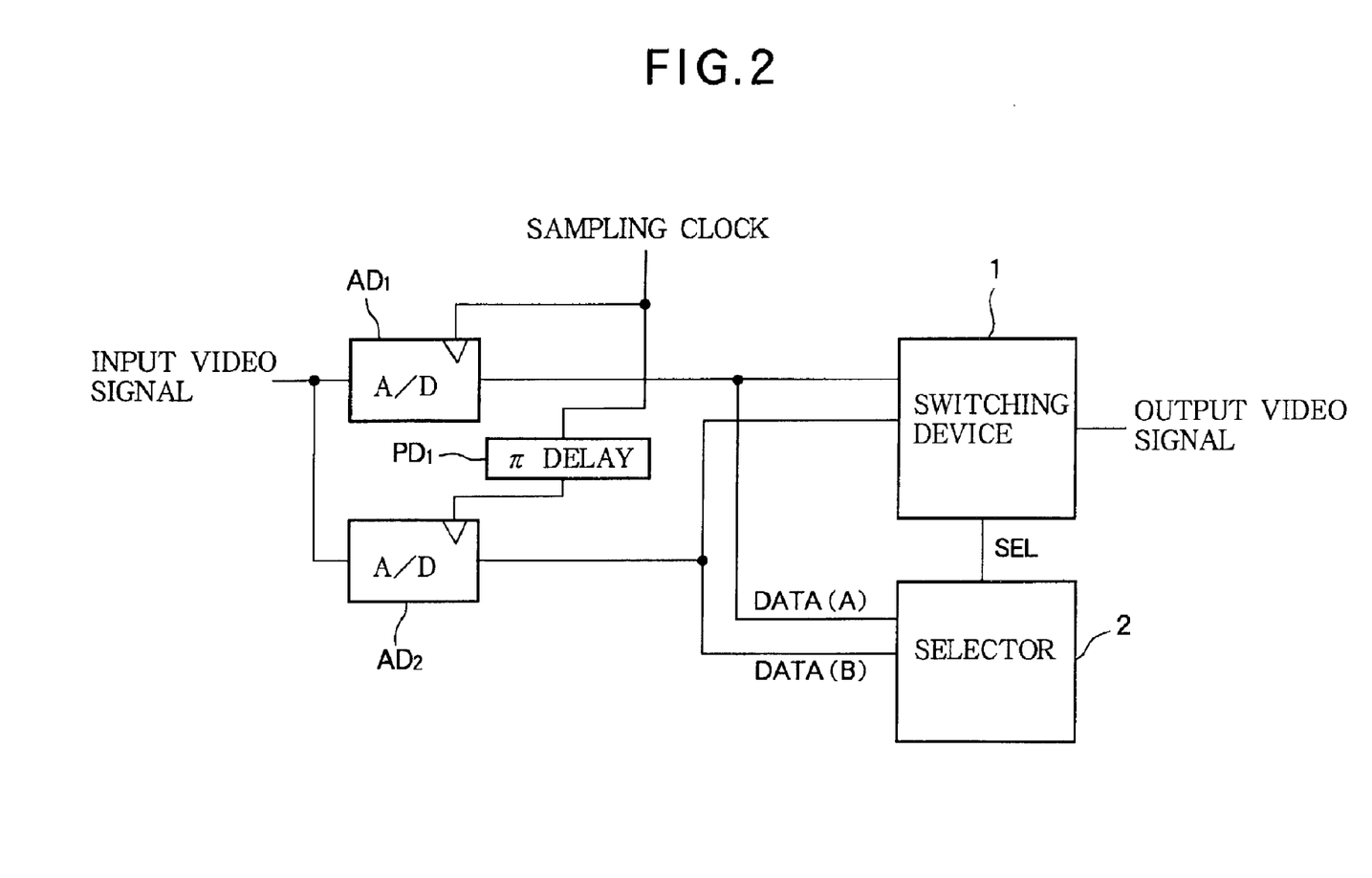
FIG. 2 is a block diagram showing a structure of the first example in a case where the number of A/D converters is 2 (N=2)

The operation of the apparatus of the first example will now be described below. Here, to simplify explanation, assume that N=2, that is, assume that the apparatus has two A/D converters and one delay element. FIG. 2 shows a structure of the apparatus of the first example in this case. In this structure, the delay element $PD_1$ delays the sampling clock by $\pi$ radians.

Figure 3:
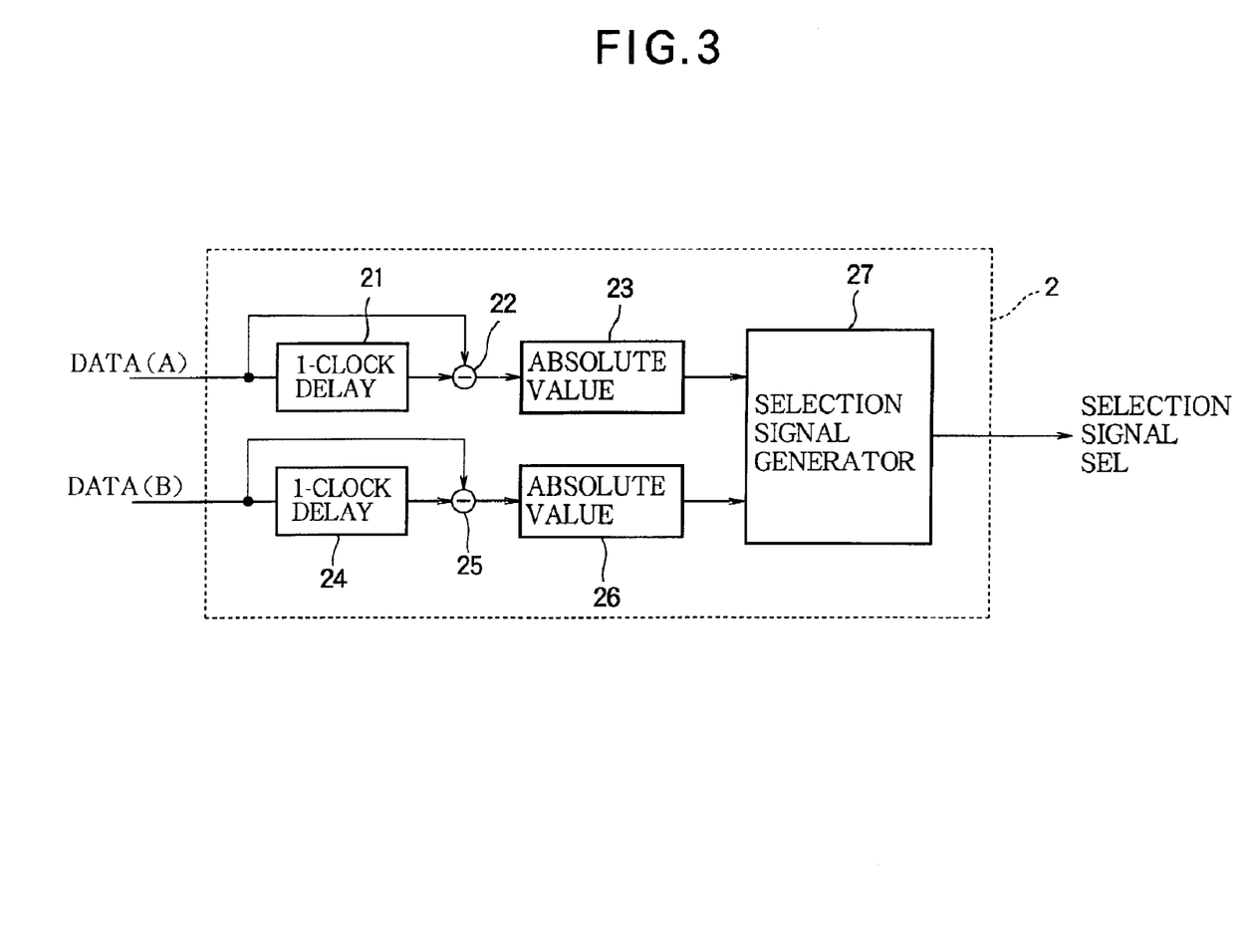
FIG. 3 is a view showing a structure of a selector used in the first example.

FIG. 3 shows a structure of the selector 2 in this case. In FIG. 3, 21 denotes a delay circuit for delaying digital data DATA (A) output from the A/D converter $AD_1$ by one clock pulse, 22 denotes a subtracter for producing a difference between the digital data DATA (A) output from the A/D converter $AD_1$ and another digital data DATA (A) delayed by one clock pulse and output from the delay circuit 21, that is, the difference between the current data and the preceding data, and 23 denotes an absolute-value processor for producing an absolute value of an output of the subtracter 22. 24 denotes a delay circuit for delaying digital data DATA (B) output from the A/D converter $AD_2$ by one clock pulse, 25 denotes a subtracter for producing a difference between the digital data DATA (B) output from the A/D converter $AD_2$ and another digital data DATA (B) delayed by one clock pulse and output from the delay circuit 24, that is, the difference between the current data and the preceding data, and 26 denotes an absolute-value processor for producing an absolute value of an output of the subtracter 25. 27 denotes a selection signal generator which compares an output of the absolute-value processor 23 with that of the absolute-value processor 26, generates a selection signal SEL used for determining which of DATA (A) and DATA (B) should be output to the outside on the basis of the result of the comparison, and supplies the selection signal SEL to the switching device 1.

Figure 4:
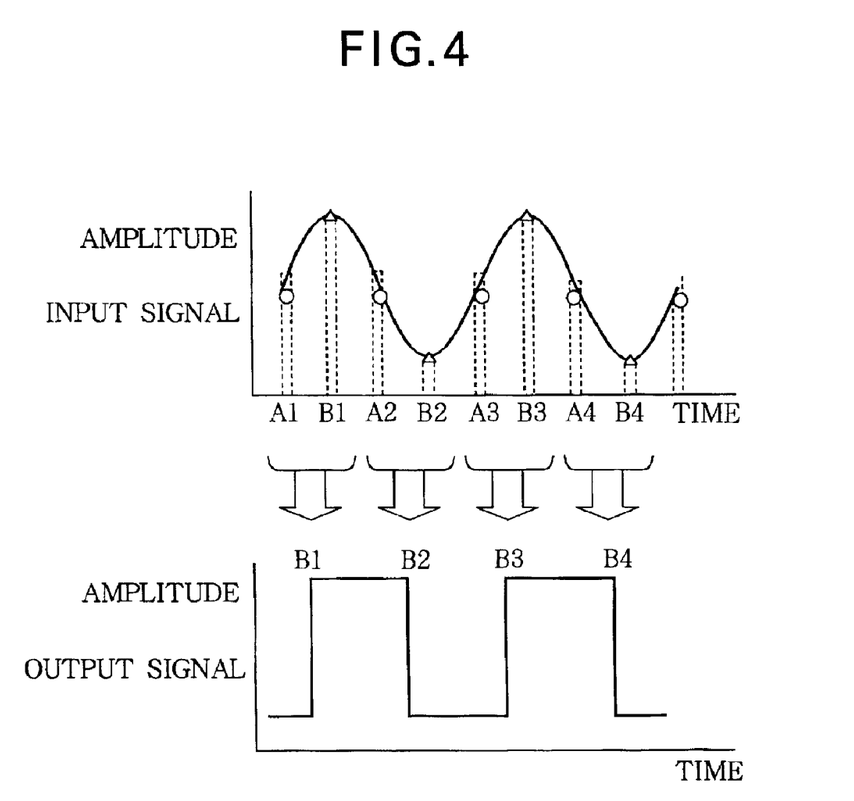
FIG. 4 is a view explaining the operation of the first example.

Here, assume that the A/D converter $AD_1$ samples an input video signal at times A1, A2, A3, A4 ..., and outputs digital data A1, A2, A3, A4 ..., and that the A/D converter $AD_2$ samples the same input video signal at times B1, B2, B3, B4 ..., and outputs digital data B1, B2, B3, B4 ..., as shown in FIG. 4.

In this case, as is apparent from FIG. 4, since |B2−B1|>|A2−A1|, the selector 2 selects the data B2 from a pair of the data A2 and the data B2. Likewise, the selector 2 selects the data B3 from a pair of the data A3 and the data B3, and selects the data B4 from a pair of the data A4 and the data B4. The switching device 1 outputs the data B1, B2, B3, B4 ... as a digital video signal to the outside in accordance with this selection made by the selector 2.

In the above-described example, the digital video signal output from the switching device 1 does not necessarily have a maximum amplitude (the amplitude of the digital video signal output when the input signal and the sampling clock are in the optimum phase relation), since the amplitude depends on the phase of the sampling clock. However, it is at least larger than the average amplitude $C_{ave}$ described with reference to FIG. 10, since the phases of the sampling clocks supplied to the two A/D converters are distant from each other by $\pi$ radians. If N is increased, that is, if the number of the A/D converters is increased, it is possible to output a digital video signal whose amplitude is always almost at its maximum irrespective of the phases of the sampling clocks.

Figure 5:
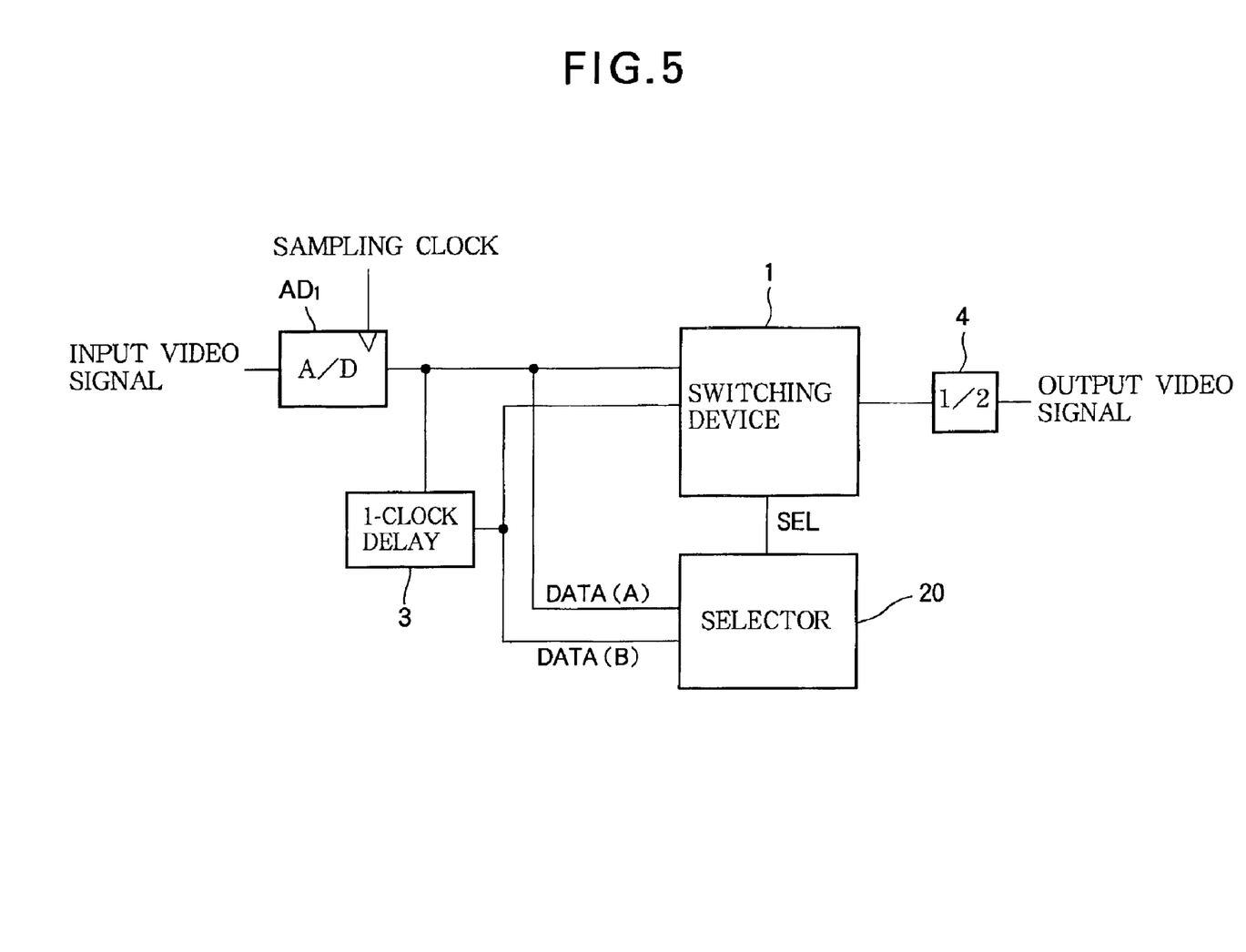
FIG. 5 is a block diagram showing a structure of a second example of the video signal sampling apparatus according to the invention.

FIG. 5 is a block diagram showing a structure of a second example of the video signal sampling apparatus according to the invention. In FIG. 5, reference numerals identical to those in FIG. 2 represent the same elements.

The second example is characterized in that, in order to dispense with the A/D converter $AD_2$, the frequency of the sampling clock is doubled and a delay element 3 for delaying the output of the A/D converter $A/D_1$ by one clock pulse is used instead of the delay element $PD_1$ for delaying the sampling clock by $\pi$ radians. In this structure, as is the case with the first example, the data A1, A2, A3, A4 . . . , and the data B1, B2, B3, B4, . . . are supplied to a selector 20 from the A/D converter $AD_1$ and the delay element 3 respectively. However, in this second example, the switching device 1 has to be provided with a sample and hold circuit 4 for reducing the samples output therefrom in half, since the frequency of the sampling clock is doubled.

Figure 6:
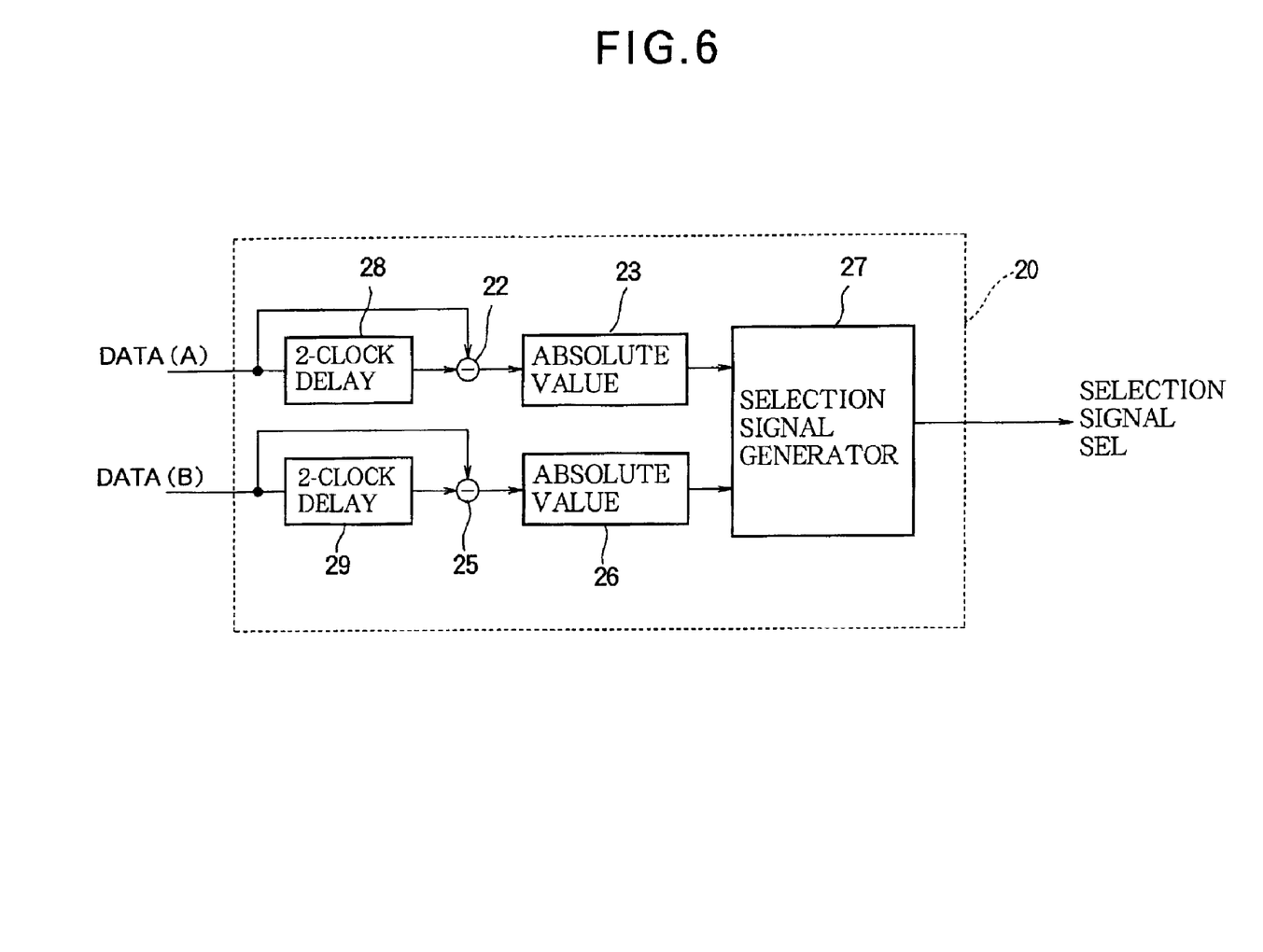
FIG. 6 is a view showing a structure of a selector used in the second example.

FIG. 6 shows a structure of the selector 20 used in the second example. The selector 20 has the same structure as the selector 2 used in the first example except that the selector 20 has delay circuits 28 and 29 for delaying DATA (A) and DATA (B) by two clock pulses respectively instead of the delay circuits 21 and 24 for delaying DATA (A) and DATA (B) by one clock pulse respectively. The selector 20 operates in the same manner as the selector 2.

Although the second example has the sample and hold circuit 4 for reducing samples being output to the outside in half, it is possible to frequency-divide the sampling clock in half to produce another sampling clock and to drive the switching device 1 and the selector 20 with this frequency-divided sampling clock. With this arrangement, the sample and hold circuit 4 can be dispensed with.

Figure 7:
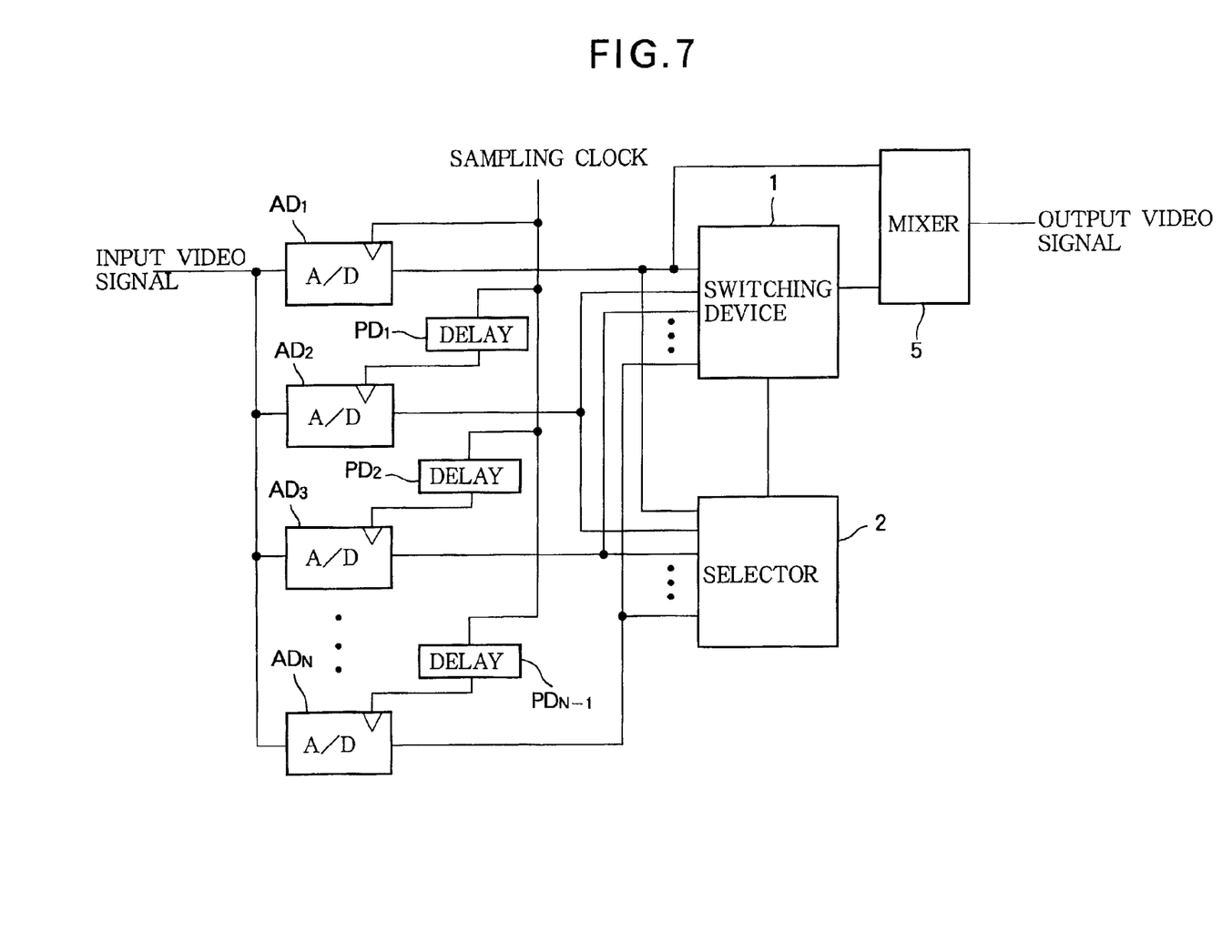
FIG. 7 is a block diagram showing a structure of a third example of the video signal sampling apparatus according to the invention.

FIG. 7 is a block diagram showing a structure of a third example of the video signal sampling apparatus according to the invention. In FIG. 7, reference numerals identical to those in FIG. 1 represent the same elements.

The third example is characterized in that a mixer 5 is provided at the output of the switching device 1. As apparent from the graph of FIG. 10, the range of amplitude variation of an output video signal, which depends on a phase relation between an input video signal and a sampling clock, increases as the frequency of the input video signal increases. In the third example, the mixer 5 mixes the signal output form the switching device 1 with one of the signals output from the A/D converters $AD_1$ to $AD_N$. The mixer 1 has an adjustable mixing ratio, and therefore, with this third example, it is possible to adjust levels of high-frequency components of the output video signal to improve image quality.

The above explained preferred embodiments are exemplary of the invention of the present application which is described solely by the claims appended below. It should be understood that modifications of the preferred embodiments may be made as would occur to one of skill in the art.

What is claimed is:

1. A video signal sampling apparatus for sampling an input analog video signal by use of a sampling clock, and producing a digital signal representing a level of a resultant video signal sample as a digital video signal to be output, said apparatus comprising:

N (N being an integer equal to or greater than 2) converters for sampling the input analog video signal by use of N sampling clocks having phases that are different from each other to produce N digital signals which represent levels of N resultant video signal samples respectively;

a selector for selecting one digital signal from the N digital signals produced by said N converters in order that an amplitude of the digital video signal output is maximized; and a switching device for outputting said one digital signal selected by said selector to the outside as the digital video signal.

2. A video signal sampling apparatus according to claim 1, in which said selector has a processor for calculating, for each of the N digital signals produced by said N converters, a difference between a value at a current sampling and a value at a preceding sampling, and for selecting, from said N digital signals, one digital signal that has a maximum absolute value of said difference.

3. A video signal sampling apparatus according to claim 1, further comprising delay elements connected in series for delaying a reference sampling clock by $2\pi/N$ radians in succession to produce said N sampling clocks to be supplied to said N converters.

4. A video signal sampling apparatus according to claim 1, further comprising a mixer for mixing the digital video signal output from said switching device with one of said N digital signals produced by said N converters.

5. A video signal sampling apparatus for sampling an input analog video signal by use of a sampling clock, and producing a digital signal which represents a level of a resultant video signal sample as a digital video signal to be output, said apparatus comprising:

a converter for sampling the input analog video signal by use of a sampling clock to produce a digital signal representing a level of a resultant video signal sample;

a selector for selecting one digital signal from a group of a first to N-th (N being an integer equal to or greater than 2) consecutive digital signals output from said converter in order that an amplitude of the digital video signal output is maximized; and a switching device for outputting said one digital signal selected by said selector as the digital video signal.

6. A video signal sampling apparatus according to claim 5, in which said selector has a processor for calculating, for each of said first to N-th digital signals output from said converter, a difference between a value at a current sampling and a value at a preceding sampling, and for selecting, from said N digital signals, one digital signal that has a maximum absolute value of said difference.

7. A video signal sampling apparatus according to claim 5, further comprising (N−1) delay element or elements for delaying output of said converter by one sampling clock pulse to (N−1) sampling clock pulses respectively to produce said first to N-th digital signals.

8. A video signal sampling apparatus according to claim 5, further comprising a sample and hold circuit for decimating samples output from said switching device to 1/N.

9. A method for sampling a video signal, comprising:
driving a plurality of converters with a plurality of clock signals, wherein each clock signal has a unique phase;
sampling a video signal using the plurality of converters to produce a plurality of digital signals; and
selecting one digital signal from the plurality of digital signals based upon an amplitude criterion.

10. An apparatus for sampling an analog signal, comprising:

a plurality of converters for producing a plurality of digital signals, wherein each converter samples an input analog signal using a sampling clock having a differing phase;

a selector operatively connected to the plurality of converters, wherein the selector chooses one digital signal from the plurality of digital signals based upon maximizing the amplitude of an output digital signal; and a switching device operatively connected to the selector and the plurality of converters, wherein the switching device outputs the one digital signal as the output digital signal.

11. A method for sampling a video signal according to claim 9, further comprising:

calculating, for each of the plurality of digital signals, a difference between a value at a current sampling and a value at a preceding sampling, wherein the amplitude criteria is a maximum absolute value of the difference.

12. A method for sampling a video signal according to claim 11, wherein the preceding sampling precedes the current sampling by two clock cycles.

13. A method for sampling a video signal according to claim 9, wherein the plurality of converters are N converters where N is an integer equal to or greater than 2, the method further comprising:

successively delaying a reference sampling clock N times with each of N iterations delaying the reference sampling clock by $2\pi/N$ radians produce the clock signals having unique phases.

14. An apparatus for sampling an analog signal according to claim 10, in which said selector includes:

a plurality of subtractors each operatively connected to a respective one of said converter, said subtractors calculating a difference between a value at current sampling and a value at preceding sampling;

a plurality of absolute value processor each operatively connected to a respective one of said subtractors, said absolute value processor determining an absolute value of the calculated difference; and a selection signal generator operatively connected to said absolute value processors, said selection signal generator selecting, from the digital signals, one digital signal that has a maximum absolute value.

15. An apparatus for sampling an analog signal according to claim 10, wherein the preceding sampling precedes the current sampling by two clock cycles.

16. An apparatus for sampling an analog signal according to claim 10, wherein the plurality of converters are N converters where N is an integer equal to or greater than 2, the apparatus further comprising:

delay elements connected in series, said delay elements successively delaying a reference sampling clock N times with each of N iterations delaying the reference sampling clock by $2\pi/N$ radians produce the sampling clock signals having differing phases.

17. An apparatus for sampling an analog signal according to claim 10, further comprising:

a mixer operatively connected to said switching device and to one of said converters, said mixer mixing the output digital signal output from said switching device with the digital signal produced by said converter connected to said mixer.

18. A video signal sampling apparatus according to claim 2, wherein the preceding sampling precedes the current sampling by two clock cycles.

19. A video signal sampling apparatus according to claim 6, wherein the preceding sampling precedes the current sampling by two clock cycles.

* * * * *